(12) United States Patent
Tan

(10) Patent No.: US 12,710,673 B2
(45) Date of Patent: Aug. 18, 2026

(54) PIXEL ARRANGEMENT STRUCTURE, DISPLAY PANEL AND DISPLAY DEVICE

(71) Applicant: BOE TECHNOLOGY GROUP CO., LTD., Beijing (CN)

(72) Inventor: Wenjing Tan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 166 days.

(21) Appl. No.: 18/893,263

(22) Filed: Sep. 23, 2024

(65) Prior Publication Data

US 2025/0015087 A1 Jan. 9, 2025

Related U.S. Application Data

(63) Continuation of application No. 18/228,307, filed on Jul. 31, 2023, now Pat. No. 12,154,907, which is a continuation of application No. 17/699,474, filed on Mar. 21, 2022, now Pat. No. 11,764,226, which is a continuation of application No. 16/630,414, filed as (Continued)

(51) Int. Cl.

| | |
|---|---|
| ***G02F 1/1335*** | (2006.01) |
| ***G06F 1/16*** | (2006.01) |
| ***H10D 86/40*** | (2025.01) |
| ***H10D 86/60*** | (2025.01) |
| ***H10K 59/35*** | (2023.01) |
| ***H10K 59/65*** | (2023.01) |

(52) U.S. Cl.

CPC ...... *G02F 1/133514* (2013.01); *G06F 1/1605* (2013.01); *H10D 86/421* (2025.01); *H10D 86/60* (2025.01); *H10K 59/353* (2023.02); *H10K 59/65* (2023.02)

(58) Field of Classification Search

CPC ............ G02F 1/133514; G06F 1/1605; H10D 86/421; H10D 86/60; H10K 59/352; H10K 59/353; H10K 59/65

See application file for complete search history.

(56) References Cited

U.S. PATENT DOCUMENTS

| | | | | |
|---|---|---|---|---|
| 11,295,701 B2 * | 4/2022 | Li | ........................ | G09G 3/2003 |
| 12,538,652 B2 * | 1/2026 | Sun | ........................... | G09F 9/33 |

(Continued)

FOREIGN PATENT DOCUMENTS

| | | | | |
|---|---|---|---|---|
| CN | 108881530 A | | 11/2018 | |
| CN | 109559650 A | * | 4/2019 | .............. G09F 9/30 |
| JP | 2008015521 A | | 1/2008 | |

OTHER PUBLICATIONS

JP 2025-017331, Notice of Reasons for Refusal, Jan. 13, 2026.

*Primary Examiner* — Michael Pervan
(74) *Attorney, Agent, or Firm* — The Webb Law Firm

(57) ABSTRACT

The present disclosure relates to a pixel arrangement structure, a display panel and a display device. The pixel arrangement structure includes: a first pixel area including a plurality of first-category pixel groups, each of which is arranged according to a first arrangement manner; and a second pixel area including a plurality of second-category pixel groups, each of which is arranged according to a second arrangement manner; wherein the first pixel area is adjacent to the second pixel area, and the first pixel area has a pixel density lower than a pixel density of the second pixel area. Embodiments of the present disclosure can improve the optical signal reception of the under-screen functional elements.

20 Claims, 9 Drawing Sheets

Related U.S. Application Data application No. PCT/CN2019/072983 on Jan. 24, 2019, now Pat. No. 11,296,119.

(56) References Cited

U.S. PATENT DOCUMENTS

2014/0071175 A1 3/2014 Yang et al.
2018/0165533 A1 6/2018 Cho et al.
2021/0049977 A1* 2/2021 Li .......................... G09G 5/026
2023/0132145 A1* 4/2023 Sun ........................... G09F 9/33 257/40
2025/0273152 A1* 8/2025 Wang ................... G09G 3/3258

* cited by examiner

PIXEL ARRANGEMENT STRUCTURE, DISPLAY PANEL AND DISPLAY DEVICE

CROSS-REFERENCE TO RELATED APPLICATIONS

This application is a continuation application of U.S. patent application Ser. No. 18/228,307 filed on Jul. 31, 2023 which is a continuation application of U.S. patent application Ser. No. 17/699,474 filed on Mar. 21, 2022 (now U.S. Pat. No. 11,764,226), which is a continuation application of U.S. patent application Ser. No. 16/630,414 filed Jan. 24, 2019 (now U.S. Pat. No. 11,296,119), which is a U.S. National Phase Entry of International Patent Application No. PCT/CN2019/072983 filed on Jan. 24, 2019, the disclosures of which are incorporated by reference herein in their entirety.

TECHNICAL FIELD

The present disclosure relates to the field of display technology, and especially to a pixel arrangement structure, a display panel and a display device.

BACKGROUND

With the development of electronic products such as mobile phones, full-screen displaying has become a development trend of products. In a full-screen mobile phone, functional elements such as a front camera and an infrared radiation (IR) hole have become important factors restricting an improvement of screen-to-body ratio. In some related arts, under-screen functional elements are provided.

SUMMARY

After research, the inventor has found that the screens in the related arts are inadequate in the light transmittance, which may affect the optical signal reception of the under-screen functional elements to a certain extent.

In view of this, embodiments of the present disclosure provide a pixel arrangement structure, a display panel, and a display device, which can improve the optical signal reception by the under-screen functional elements.

In one aspect of the present disclosure, a pixel arrangement structure is provided. The pixel arrangement structure includes:

a first pixel area including a plurality of first-category pixel groups, sub-pixels in each first-type pixel group of which is arranged according to a first arrangement manner; and a second pixel area including a plurality of second-category pixel groups, sub-pixels in each second-type pixel group of which is arranged according to a second arrangement manner;

wherein the first pixel area is adjacent to the second pixel area, and the first pixel area has a pixel density lower than a pixel density of the second pixel area.

In some embodiments, the first arrangement manner is a Real arrangement, and the second arrangement manner is a Pentile arrangement.

In some embodiments, the pixel density of the first pixel area is 1/N of the pixel density of the second pixel area, where N is an integer greater than 1.

In some embodiments, each of the first-category pixel groups includes a first sub-pixel of a first color, a second sub-pixel of a second color, and a third sub-pixel of a third color, wherein lines connecting centers of the first sub-pixel, the second sub-pixel, and the third sub-pixel form a triangle, the plurality of first-category pixel groups are arranged in an array, and in the first pixel area, centers of first sub-pixels of each column of the first-category pixel groups are in a same straight line, centers of the first sub-pixels of each row of the first-category pixel groups are in a same straight line, and centers of second sub-pixels and third sub-pixels of each row of the first-category pixel groups are all in a same straight line.

In some embodiments, centers of the second sub-pixels of each column of the first-category pixel groups are in a same straight line, and centers of the third sub-pixels of each column of the first-category pixel groups are in a same straight line in the first pixel area.

In some embodiments, positions of the second sub-pixels and the third sub-pixels respectively with respect to the first sub-pixels in odd-numbered rows of the first-category pixel groups of each column of the first-category pixel groups in the first pixel area are opposite to positions of the second sub-pixels and the third sub-pixels respectively with respect to the first sub-pixels in even-numbered rows.

In some embodiments, each of the second-category pixel groups includes a fourth sub-pixel of the first color, a fifth sub-pixel of the second color, a sixth sub-pixel of the third color, and a seventh sub-pixel of the first color, and the second-category pixel groups are divided into a group of first pixels and a group of second pixels according to an arrangement manner of sub-pixels, the plurality of second-category pixel groups are arranged in an array, and the group of first pixels and the group of second pixels are both repeatedly arranged along a row direction, and arranged alternatively along a column direction;

the centers of the first sub-pixels of each column of the first-category pixel groups in the first pixel area, and centers of seventh sub-pixels of the group of first pixels and fourth sub-pixels of the group of second pixels in the second pixel area are in a same straight line.

In some embodiments, centers of the second sub-pixels of each column of the first-category pixel groups of at least partial rows in the first pixel area, and centers of fifth sub-pixels of a corresponding column of the second-category pixel groups in the second pixel area are in a same straight line.

In some embodiments, a plurality of eighth sub-pixels of the first color are provided at positions in the second pixel area adjacent to the first pixel area, wherein each eighth sub-pixel is located between the second sub-pixel in one of every two adjacent columns of the first-category sub-pixels in the first pixel area and the third sub-pixel in another of every two adjacent columns of the first-category sub-pixels in the first pixel area.

In some embodiments, the second sub-pixel, the third sub-pixel, the fifth sub-pixel, and the sixth sub-pixel all have a same shape, shapes of the first sub-pixel, the fourth sub-pixel and the seventh sub-pixel are all same or all different.

In some embodiments, each of sub-pixels in the first-category pixel groups has a shape of a quadrilateral or a hexagon, and each of sub-pixels in the second-category pixel groups has a shape of a quadrilateral, a pentagon or a hexagon.

In some embodiments, sub-pixels adjacent to each other in the first pixel area and the second pixel area have different colors.

In some embodiments, the first color is green, the second color is red, and the third color is blue.

In some embodiments, the fourth sub-pixel and the seventh sub-pixel have an equal area, the fifth sub-pixel and the sixth sub-pixel have an equal area, and the fourth sub-pixel has an area smaller than or equal to that of the fifth sub-pixel.

In one aspect of the present disclosure, a pixel display panel is provided. The display panel includes the foregoing pixel arrangement structure.

In one aspect of the present disclosure, a display device is provided. The display device includes:

the foregoing display panel; and a functional element located on an opposite side of a light emitting side of the display panel, wherein a projection of a light receiving surface of the functional element on the display panel is located in the first pixel area, to receive an incident light from the light emitting side of the display panel.

In some embodiments, the functional element includes at least one of a camera, an IR element, a reflective induction element, and an ambient light sensor.

BRIEF DESCRIPTION OF THE DRAWINGS

The accompanying drawings, which constitute part of this specification, illustrate exemplary embodiments of the present disclosure, and together with this specification, serve to explain the principles of the present disclosure.

The present disclosure may be more clearly understood from the following detailed description with reference to the accompanying drawings, in which.

Figure 1:
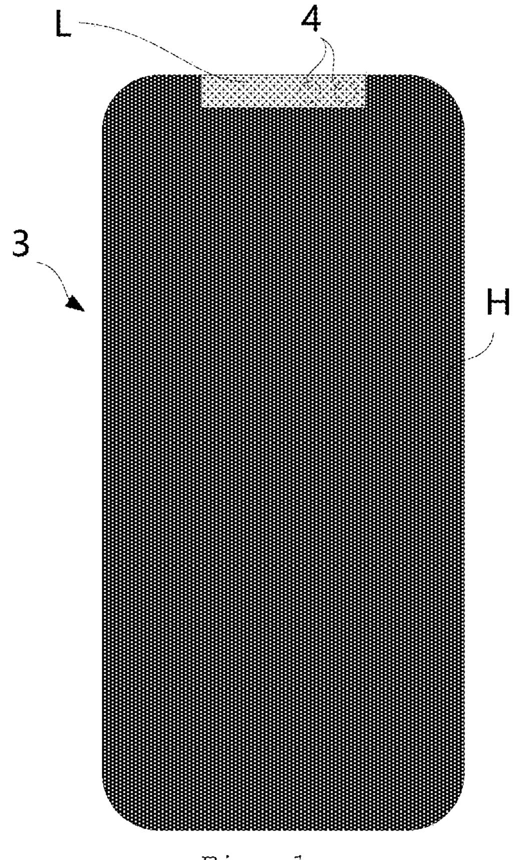
FIG. 1 is a schematic structural view according to one embodiment of a display device of the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or variants thereof means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (including technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In some related arts, functional elements such as the front camera and IR hole are provided under the screen of a full-screen mobile phone. After research, the inventor has found that the screens in the related arts are inadequate in the light transmittance, which may affect the optical signal reception of the under-screen functional elements to a certain extent.

In view of this, embodiments of the present disclosure provide a pixel arrangement structure, a display panel, and a display device, which can improve the optical signal reception of the under-screen functional elements.

FIG. 1 is a schematic structural view according to one embodiment of a display device of the present disclosure.

Referring to FIG. 1, in some embodiments, the display device includes a display panel 3 and a functional element 4. The display panel 3 includes a specific pixel arrangement structure including a first pixel area L and a second pixel area H adjacent to each other. The first pixel area L and the second pixel area H adjacent to each other means that the distance between the edge of the first pixel area L adjacent to the second pixel area H and the second pixel area H is smaller than the height of the sub-pixel in the first pixel area L along a column direction. In FIG. 1, a major part of the display panel 3 is a second pixel area H, and the first pixel area L is located at an upper edge of the second pixel area H.

The functional element 4 can be located on an opposite side of the light emitting side of the display panel 3, and the light receiving surface of the functional element 4 corresponds to the first pixel area L in the pixel arrangement structure of the display panel 3, and is configured to receive an incident light from the light emitting side of the display panel 3.

The functional element 4 can include a camera element, such as a front camera of a mobile phone. The functional element can also include an IR element, a reflective induction element, or an ambient light sensor. The first pixel area L and the second pixel area H can display an image, and the functional element can also receive the incident light from the outside of the display panel through the first pixel area of the display panel 3.

In order to increase the light transmittance of the first pixel area L, the first pixel area L can be made to have a pixel density lower than a pixel density of the second pixel area H. Therefore, according to embodiments of the present disclosure, the first pixel area and the second pixel area adjacent to each other respectively include pixel groups in different arrangement manners, and the first pixel area has a pixel density lower than that of the second pixel area. In this way, on one hand, it is possible to reduce the light emitting area of the first pixel area, and increase the light transmittance, so that the functional element receives more light signals; on the other hand, it is also possible to simplify the design of the backplane circuit of the first pixel area.

Figure 2:
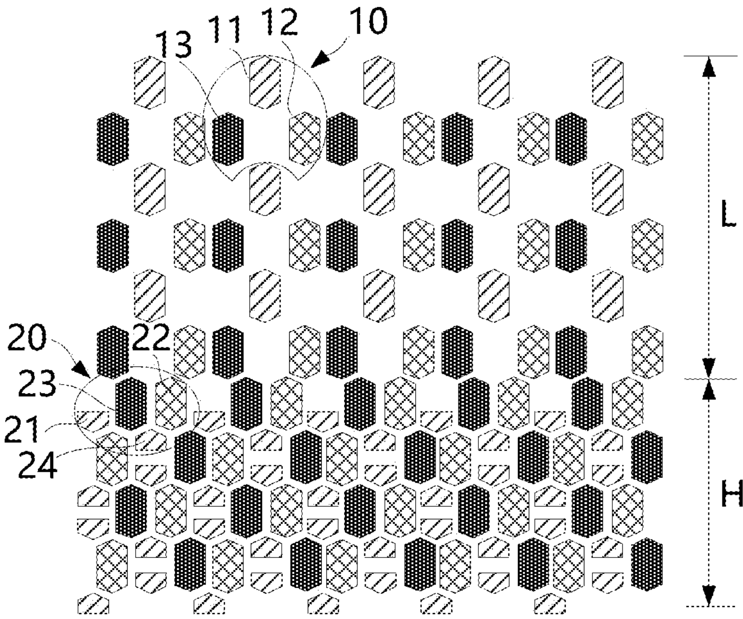
FIG. 2 is a schematic pixel arranging diagram according to one embodiment of the pixel arrangement structure of the present disclosure.

FIG. 2 is a schematic pixel arranging diagram according to one embodiment of the pixel arrangement structure of the present disclosure.

Referring to FIG. 2, in some embodiments, the first pixel area L includes a plurality of first-category pixel groups 10. Sub-pixels in each first-type pixel group of the first-category pixel groups 10 is arranged according to a first arrangement manner. The first arrangement manner can be a Real arrangement (i.e., Real RGB). This arrangement manner can include red (R) sub-pixels, green (G) sub-pixels, and blue (B) sub-pixels arranged in several arrays, and the sub-pixels having three different colors are crossed therebetween, to present a shape which is approximately a "delta shape". The second pixel area H includes a plurality of second-category pixel groups. Sub-pixels in each second-type pixel group of the second-category pixel groups is arranged according to a second arrangement manner. The second arrangement manner is alternatively a Pentile arrangement, that is, a sub-pixel is added on the basis of RGB to realize, for example, red, green, blue and green (RGBG), red, green, blue and white (RGBW), red, green, blue and yellow (RGBY), or the like. Moreover, partial sub-pixels in the Pentile arrangement are "shared", thereby achieving a higher resolution than an actual resolution in a visual effect.

The first-category pixel groups 10 which uses a Real arrangement, can minimize a visual effect loss of the first pixel area L. Since the first pixel area L has a pixel density lower than that of the second pixel area H, compared to the use of a virtual resolution, the first pixel area L having the pixel group which uses a real resolution can improve a visual experience of human eye. In addition, the number of sub-pixels having R and B colors in the Real arrangement manner is twice that of the Pentile arrangement manner. Therefore, at the same aperture ratio (i.e., the same brightness), each sub-pixel of the pixel group in a Real arrangement has a brightness half of that of each sub-pixel of the pixel group in a Pentile arrangement, and correspondingly has a required sub-pixel current also half of that in a Pentile arrangement, thereby reducing a service life attenuation rate of the sub-pixel.

In FIG. 2, the first pixel area L is adjacent to the second pixel area H. The number of sub-pixels in the first pixel area L based on a Real arrangement along a row direction and a column direction is reduced by ½ compared to the number of sub-pixels in the second pixel area H based on a Pentile arrangement, so that the pixel density of the first pixel area L can be ½ of the pixel density of the second pixel area H. In other embodiments, the ratio of the pixel density of the first pixel area L to that of the second pixel area H can be 1/N, wherein N is an integer greater than 1. Here, the pixel density of the first pixel area L is a density of actual pixels. Actual pixel refers to a physical pixel, that is, the smallest physical unit capable of controlling display of the display panel. The pixel density of the second pixel area His a density of virtual pixels. Virtual pixel also refers to as an intuition pixel, whose color is obtained by mixing a plurality of adjacent color pixels. The bright spots formed by the virtual pixel are scattered and located between various actual sub-pixels.

Referring to FIG. 2, in some embodiments, the first-category pixel group 10 include a first sub-pixel 11 of a first color, a second sub-pixel 12 of a second color, and a third sub-pixel 13 of a third color (different colors are distinguished by different filling patterns in the drawings). Lines connecting centers of the first sub-pixel 11, the second sub-pixel 12, and the third sub-pixel 13 can form a triangle. In FIG. 2, the first sub-pixel 11 in the first-category pixel group 10 is located on one side of the second sub-pixel 12 and the third sub-pixel 13 away from the second pixel area H (i.e., an upper side of the second sub-pixel 12 and the third sub-pixel 13 in FIG. 2).

In some embodiments, the first color is green, the second color is red, and the third color is blue to form the three primary colors of RGB. In other embodiments, the first color is green, the second color is blue, and the third color is red. In other embodiments, the three colors can also be other colors, such as cyan, magenta, and yellow, to form the three primary colors of CMY.

A plurality of first-category pixel groups 10 are arranged in an array. The centers of the first sub-pixels 11 of each column of the first-category pixel groups in the first pixel area L are in a same straight line. For an embodiment in which the first color is green, human eye is more sensitive to green sub-pixels. Therefore, when the green sub-pixels are linearly aligned along a column direction, the pixel arrangement within the first pixel area L can be more uniform visually. In addition, the centers of the first sub-pixels 11 of each row of the first-category pixel groups 10 can also be in a same straight line, and the centers of the second sub-pixels and the third sub-pixels of each row of the first-category pixel groups 10 can be all in the same straight line. By aligning the first sub-pixels along a row direction in a straight line, with the second sub-pixels and the third sub-pixels also aligned in a straight line, the white point distribution formed by the first-category pixel groups 10 can be more uniform, thereby improving the display quality.

In FIG. 2, in each column of the first-category pixel groups 10 in the first pixel area L, the centers of the second sub-pixels 12 are in the same straight line, and the centers of the third sub-pixels 13 are in the same straight line. In this way, the second color and the third color within the first pixel area L can form a vertical line with a favorable consistency along a column direction, and the first sub-pixels of the first color that also line up in the column direction, thereby making the pixel arrangement of the first pixel area L along a column direction and a row direction more uniform visually, and further improving the display quality.

Referring to FIG. 2, in some embodiments, the second-category pixel groups 20 include a fourth sub-pixel 21 of the first color, a fifth sub-pixel 22 of the second color, a sixth sub-pixel 23 of the third color, and a seventh sub-pixel 24 of the first color. Here, the first color, the second color, and the third color can refer to the colors of the sub-pixels in the first pixel area L. For example, the first color is green, the second color is red, and the third color is blue.

Figure 3:
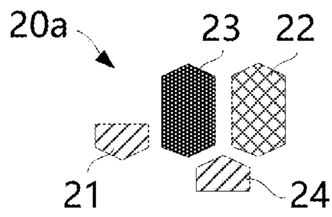
FIGS. 3 and 4 are respectively schematic pixel arranging diagrams of pixel groups in odd-numbered rows and even-numbered rows in the second display area according to one embodiment of the pixel arrangement structure of the present disclosure.
Figure 4:
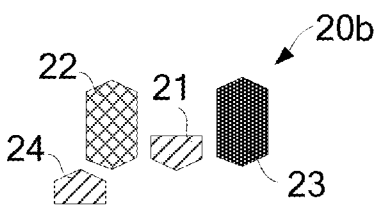

FIGS. 3 and 4 are respectively schematic pixel arranging diagrams of pixel groups in odd-numbered rows and even-numbered rows in a second display area according to one embodiment of the pixel arrangement structure of the present disclosure.

Referring to FIGS. 3 and 4, the second-category pixel groups 20 in the embodiment of FIG. 2 can be divided into a group of first pixels 20*a* and a group of second pixels 20*b* according to an arrangement manner of the sub-pixels. The plurality of second-category pixel groups 20 can be arranged in an array. The first pixels 20*a* and the second pixels 20*b* are both repeatedly arranged along a row direction and arranged alternatively along a column direction.

In FIG. 3, the fourth sub-pixel 21 of the first pixel 20*a* is located on a left side of the sixth sub-pixel 23, the fifth sub-pixel 22 is located on a right side of the sixth sub-pixel 23, and the seventh sub-pixel 24 is located between the fifth sub-pixel 22 and the sixth sub-pixel 23 and on a lower side of the fifth sub-pixel 22 and the sixth sub-pixel 23. In FIG. 4, the seventh sub-pixel 24 of the second pixel 20*b* is located on a lower left side of the fifth sub-pixel 22, the fourth sub-pixel 21 is located on a right side of the fifth sub-pixel 22, and the sixth sub-pixel 23 is located on a right side of the fourth sub-pixel 21. In the first pixels 20*a* and the second pixels 20*b*, the fourth sub-pixel 21 and the seventh sub-pixel 24 are both in the first color.

Referring to FIG. 2, in some embodiments, the centers of the first sub-pixels 11 of each column of the first-category pixel groups 10 in the first pixel area L and the center of one of the fourth sub-pixel 21 and the seventh sub-pixel 24 of each column of the second-category pixel groups 20 in the second pixel area H are in a same straight line. For an embodiment in which the first color is green, human eye is more sensitive to green sub-pixels. Therefore, when the green sub-pixels are linearly aligned along a column direction of the first pixel area L and the second pixel area H, the white lines within the first pixel area L and the second pixel area H adjacent to each other along a column direction are more matched, so that the first pixel area L and the second pixel area H have a relatively smaller image change and offset, thereby enhancing the image quality.

FIGS. 5-8 are respectively schematic pixel arranging diagrams according to some embodiments of the pixel arrangement structure of the present disclosure.

Figure 5:
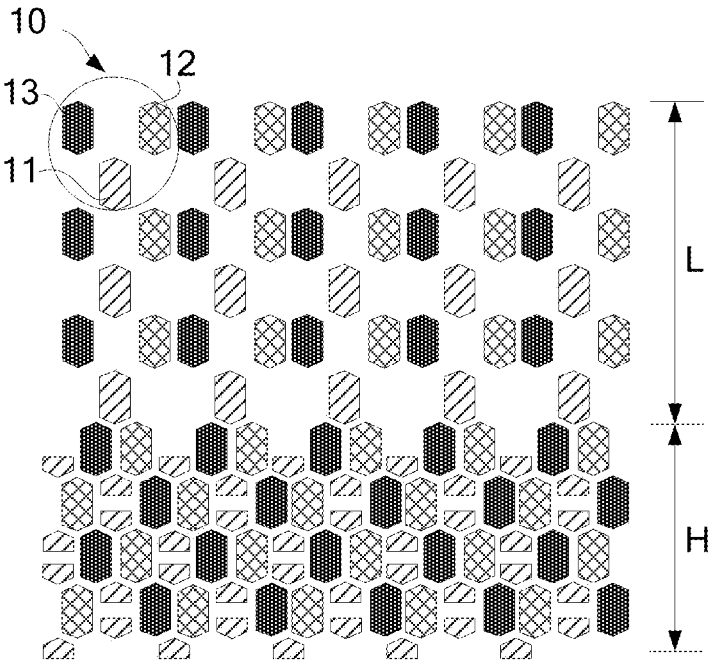
FIGS. 5-8 are respectively schematic pixel arranging diagrams according to some embodiments of the pixel arrangement structure of the present disclosure.

Referring to FIGS. 2 and 5, by comparing the embodiment of FIG. 5 and the embodiment of FIG. 2, the difference lies in that the first sub-pixel 11 in the first-category pixel groups 10 in the first pixel area L is located on one side of the second sub-pixel 12 and the third sub-pixel 13 adjacent to the second pixel area H (i.e., lower sides of the second sub-pixel 12 and the third sub-pixel 13 in FIG. 5). This makes the sub-pixels of the first pixel area L adjacent to the second pixel area H to be the second sub-pixel 12 and the third sub-pixel 13, and the sub-pixel of the second pixel area H adjacent to the first pixel area L to be the first sub-pixel 11, so that the sub-pixels of the first pixel area L and the second pixel area H adjacent to each other have different colors, thereby reducing or eliminating the color shift risk caused by color accumulation of the second sub-pixel and the third sub-pixel at a boundary position of the two pixel positions, and enhancing the image quality.

Figure 6:
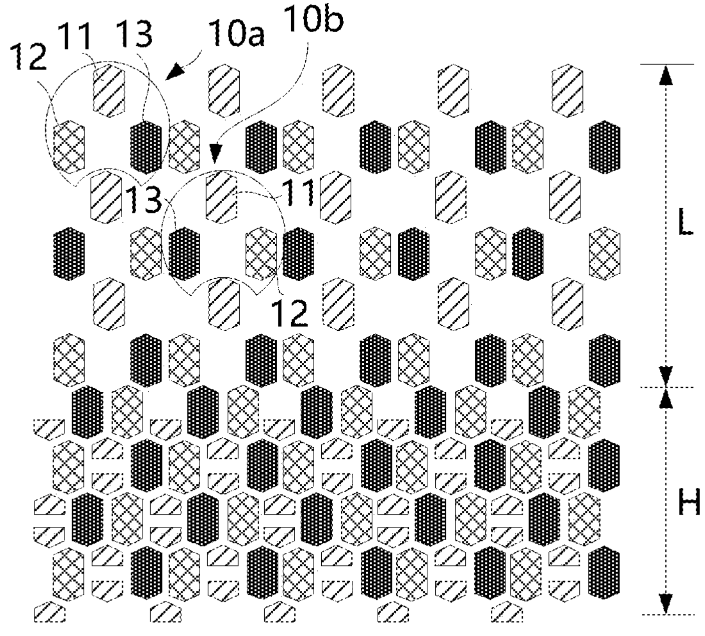

Referring to FIGS. 2 and 6, by comparing the embodiment of FIG. 6 and the embodiment of FIG. 2, the difference lies in that the first-category pixel groups in odd-numbered and even-numbered rows in the first pixel area L have different arrangement manners. In FIG. 6, positions of the second sub-pixel 12 and the third sub-pixel 13 in the first-category pixel groups 10*a* in the odd-numbered rows with respect to the first sub-pixel 11 are different from the positions of the second sub-pixel 12 and the third sub-pixel 13 in the first-category pixel groups 10*b* in the even-numbered rows with respect to the first sub-pixel 11. The first-category pixel groups 10*a* in the odd-numbered rows and the first-category pixel groups 10*b* in the even-numbered rows are arranged at intervals along a column direction. This pixel structure can make the first pixel area L form an alternating form of the second sub-pixel 12 of the second color and the third sub-pixel of the third color along a column direction, which can reduce the color shift risk accumulated in a single color, thereby enhancing the image quality.

In addition, referring to FIG. 6, in some embodiments, the centers of the second sub-pixels 12 of each column of the first-category pixel groups 10*a* or 10*b* in at least partial rows in the first pixel area L and the fifth sub-pixels 22 in a corresponding column of the second-category pixel groups 20 in the second pixel area H are in the same straight line. In this way, the first pixel area L and the second pixel area H can form lines of a second color with relatively consistent shapes. Similarly, the centers of the third sub-pixels 13 of each column of the first-category pixel groups 10*a* or 10*b* in at least partial rows in the first pixel area L and the sixth sub-pixels 23 in a corresponding column of the second-category pixel groups 20 in the second pixel area H are in the same straight line. In this way, the first pixel area L and the second pixel area H can have a relatively smaller image change and offset, thereby improving the image quality.

In FIG. 6, the sub-pixels of the first pixel area L and the second pixel area H adjacent to each other have different colors, so that it is possible to effectively reduce or eliminate the color shift risk caused by accumulation of the sub-pixels having the same color at a boundary position of the two pixel positions, and enhancing the image quality.

Figure 7:
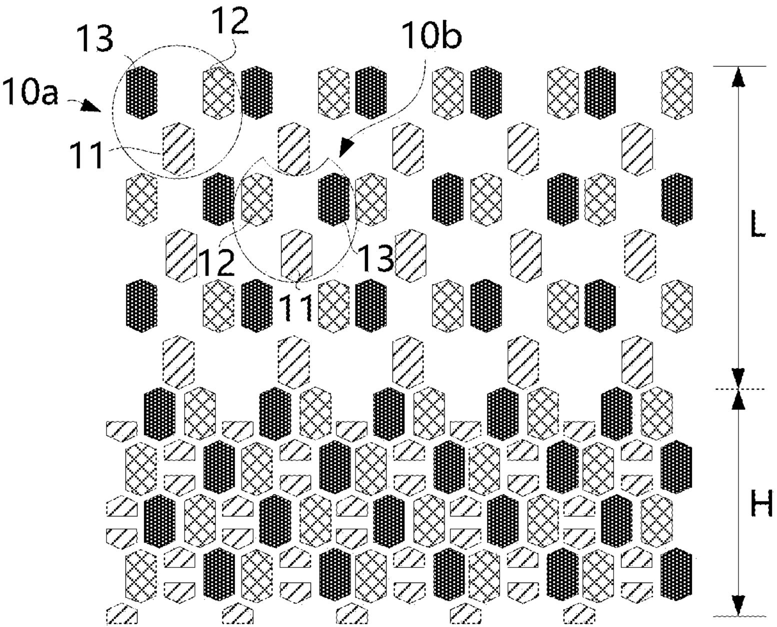

Referring to FIGS. 5 and 7, by comparing the embodiment of FIG. 7 and the embodiment of FIG. 5, the difference lies in that the first-category pixel groups in odd-numbered and even-numbered rows in the first pixel area L have different arrangement manners. In FIG. 7, the positions of the second sub-pixel 12 and the third sub-pixel 13 in the first-category pixel groups 10*a* in the odd-numbered rows relative to the first sub-pixel 11 are opposite to the positions of the second sub-pixel 12 and the third sub-pixel 13 in the first-category pixel groups 10*b* in the even-numbered rows relative to the first sub-pixel 11. The first-category pixel groups 10*a* in the odd-numbered rows and the first-category pixel groups 10*b* in the even-numbered rows are arranged at intervals along a column direction. This pixel structure can make the first pixel area L form an alternating form of the second sub-pixel 12 of the second color and the third sub-pixel of the third color along a column direction, which can reduce the color shift risk of single color accumulation, thereby enhancing the image quality.

In addition, referring to FIG. 7, in some embodiments, the centers of the second sub-pixels 12 of each column of the first-category pixel groups 10*a* or 10*b* in at least partial rows in the first pixel area L and the centers of the fifth sub-pixels 22 of the second-category pixel groups 20 in a corresponding column in the second pixel area H are in the same straight line. In this way, the first pixel area L and the second pixel area H can form lines of a second color with relatively consistent shapes. Similarly, the centers of the third sub-pixels 13 of each column of the first-category pixel groups 10*a* or 10*b* in at least partial rows in the first pixel area L and the center of the sixth sub-pixels 23 of the second-category pixel groups 20 in a corresponding column in the second pixel area H are in the same straight line. In this way, the first pixel area L and the second pixel area H can have a relatively smaller image change and offset, thereby improving the image quality.

In FIG. 7, the sub-pixels of the first pixel area L and the second pixel area H adjacent to each other have different colors, so that it is possible to effectively reduce or eliminate the color shift risk caused by accumulation of the sub-pixels having the same color at a boundary position of the two pixel areas, and enhancing the image quality.

Figure 8:
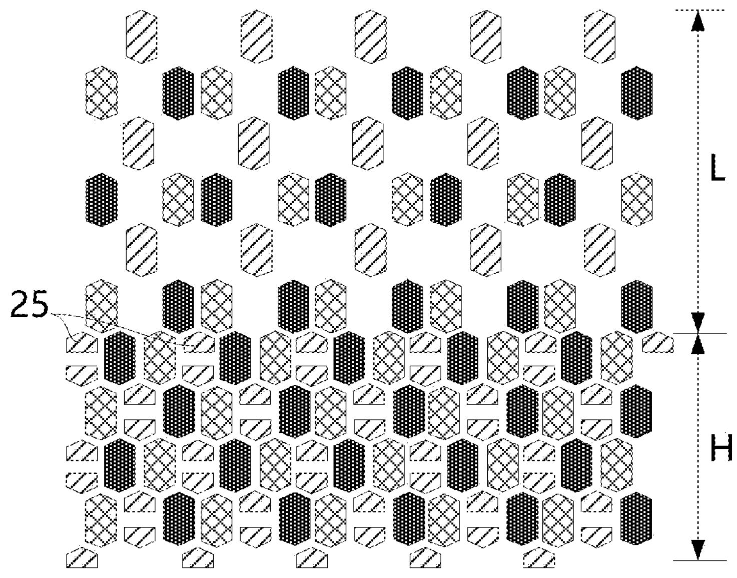

Compared with the above-described embodiments, referring to FIG. 8, in some embodiments, a plurality of eighth sub-pixels 25 of the first color in the second pixel area can be provided adjacent to the first pixel area L. The eighth sub-pixel 25 is located between the second sub-pixel in one of every two adjacent columns of the first-category sub-pixels in the first pixel area and the third sub-pixel in another of every two adjacent columns of the first-category sub-pixels in the first pixel area. In FIG. 8, at a location where the first pixel area L is adjoined with the second pixel area H, the sub-pixels of the second color and the sub-pixels of the third color are present alternately, and the sub-pixels of the second color and the sub-pixels of the third color are mixed by adding the eighth sub-pixel 25, so that it is possible to eliminate a purple color bleeding risk at the adjoining location, thereby enhancing the image quality.

The eighth sub-pixel 25 can also be added to other embodiments. For example, in the embodiments of FIGS. 2 and 6, the eighth sub-pixel 25 can be disposed at a position in the second pixel area H adjacent to the first pixel area L, and between the second sub-pixel and the third sub-pixel pixel between every two adjacent columns of the first-category sub-pixels in the first pixel area.

Referring to FIGS. 2 to 8, in some embodiments, the second sub-pixel 12, the third sub-pixel 13, the fifth sub-pixel 22, and the sixth sub-pixel 23 all have a same shape, which is hexagonal. The first sub-pixel 11 is a hexagon, which has the same shape as that of the second sub-pixel 12 and the third sub-pixel 13, but the shape of the first sub-pixel 11 is different from that of the fourth sub-pixel 21 or the seventh sub-pixel 22. The shapes of the fourth sub-pixel 21 and the seventh sub-pixel 24 are pentagons with opposite directions respectively, and having an equal area. The fifth sub-pixel 22 and the sixth sub-pixel 23 have an equal area, and the fourth sub-pixel 21 has an area smaller than that of the fifth sub-pixel 22.

In above-described various embodiments of each pixel arrangement structure of the present disclosure, the shapes and arrangement manners of the sub-pixels in each pixel group are not limited to those shown in FIGS. 2 to 8, and other shapes and arrangement manners can also be used.

Figure 9:
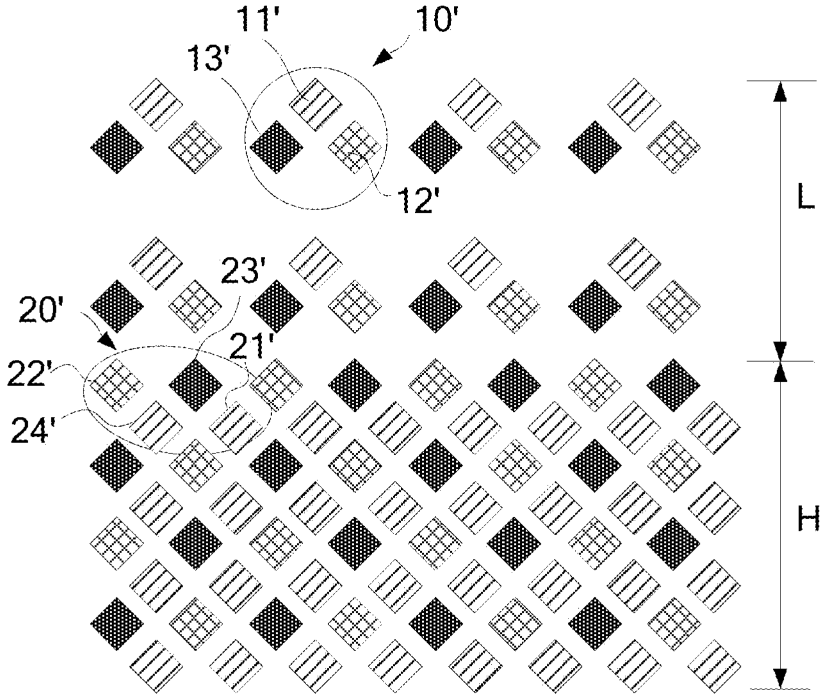
FIG. 9 is a schematic pixel arranging diagram according to another embodiment of the pixel arrangement structure of the present disclosure.

FIG. 9 is a schematic pixel arranging diagram according to another embodiment of the pixel arrangement structure of the present disclosure.

Referring to FIG. 9, in some embodiments, the first-category pixel groups 10' include a first sub-pixel 11' of a first color, a second sub-pixel 12' of a second color, and a third sub-pixel 13' of a third color (different colors are distinguished by different filling patterns in the drawings). The lines connecting centers of the first sub-pixel 11', the second sub-pixel 12', and the third sub-pixel 13' can form a triangle. In FIG. 9, the first sub-pixel 11' in the first-category pixel groups 10' is located on one side of the second sub-pixel 12' and the third sub-pixel 13' away from the second pixel area H (i.e., an upper side of the second sub-pixel 12' and the third sub-pixel 13' in FIG. 9).

In some embodiments, the first color is green, the second color is red, and the third color is blue to form the three primary colors of RGB. In other embodiments, the first color is green, the second color is blue, and the third color is red. In other embodiments, the three colors can also be other colors, such as cyan, magenta, and yellow, to form the three primary colors of CMY.

In FIG. 9, in some embodiments, the second-category pixel groups 20' include a fourth sub-pixel 21' of the first color, a fifth sub-pixel 22' of the second color, a sixth sub-pixel 23' of the third color, and a seventh sub-pixel 24' of the first color. In the present embodiment, each of the sub-pixels in the first-category pixel groups 10' and the second-category pixel groups 20' has a same shape, which is square, and presents 45° in a row direction and a column direction.

Figure 10:
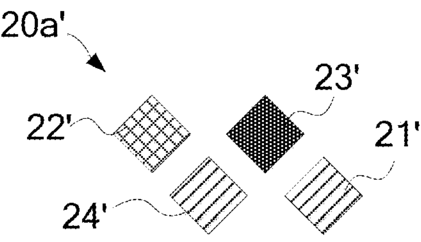
FIGS. 10 and 11 are respectively schematic pixel arranging diagrams of pixel groups in odd-numbered rows and even-numbered rows in the second display area according to another embodiment of the pixel arrangement structure of the present disclosure.
Figure 11:
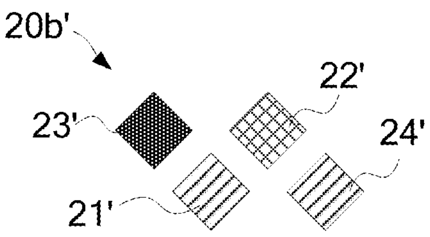

FIGS. 10 and 11 are respectively schematic pixel arranging diagrams of pixel groups in odd-numbered rows and even-numbered rows in a second display area according to another embodiment of the pixel arrangement structure of the present disclosure.

Referring to FIGS. 10 and 11, the second-category pixel groups 20' in the embodiment of FIG. 9 can be divided into a first pixels 20*a*' and a second pixels 20*b*' according to an arrangement manner of the sub-pixels. The plurality of repeated second-category pixel groups 20' can be arranged in an array. The first pixels 20*a*' and the second pixels 20*b*' are both repeatedly arranged along a row direction, and arranged alternatively along a column direction.

In FIG. 10, the seventh sub-pixel 24' of the first pixel 20*a*' is located on a lower side of the fifth sub-pixel 22' and the sixth sub-pixel 23' and between the fifth sub-pixel 22' and the sixth sub-pixel 23', the fifth sub-pixel 22' is located on a left side of the sixth sub-pixel 23', and the fourth sub-pixel 21' is located on a lower right side of the sixth sub-pixel 23'. In FIG. 11, the fourth sub-pixel 21' of the first pixel 20*a*' is located on a lower side of the fifth sub-pixel 22' and the sixth sub-pixel 23' and between the fifth sub-pixel 22' and the sixth sub-pixel 23', the fifth sub-pixel 22' is located on a right side of the sixth sub-pixel 23', and the seventh sub-pixel 24' is located on a lower right side of the fifth sub-pixel 22'. In the first pixel 20*a*' and the second pixel 20*b*', the fourth sub-pixel 21' and the seventh sub-pixel 24' are both in the first color.

FIGS. 12 to 15 are respectively schematic pixel arranging diagrams according to other embodiments of the pixel arrangement structure of the present disclosure.

Referring to FIGS. 9, 12-15, in some embodiments, a plurality of repeated first-category pixel groups 10' are arranged in an array. The centers of the first sub-pixels 11' of each column of the first-category pixel groups 10' in the first pixel area L are in the same straight line. For an embodiment in which the first color is green, human eye is more sensitive to green sub-pixels. Therefore, when the green sub-pixels are linearly aligned along a column direction, the pixel arrangement within the first pixel area L can be more uniform visually. In addition, the centers of the first sub-pixels 11' of each row of the first-category pixel groups 10' can also be in a same straight line, and the centers of the second sub-pixels 12' and the third sub-pixels 13' can be both in a same straight line. By aligning the first sub-pixels 11' in a row direction, and aligning the second sub-pixels 12' and the third sub-pixels 13' in a straight line, the white point distribution formed by the first-category pixel groups 10' can be more uniform, thereby improving the display quality.

Figure 12:
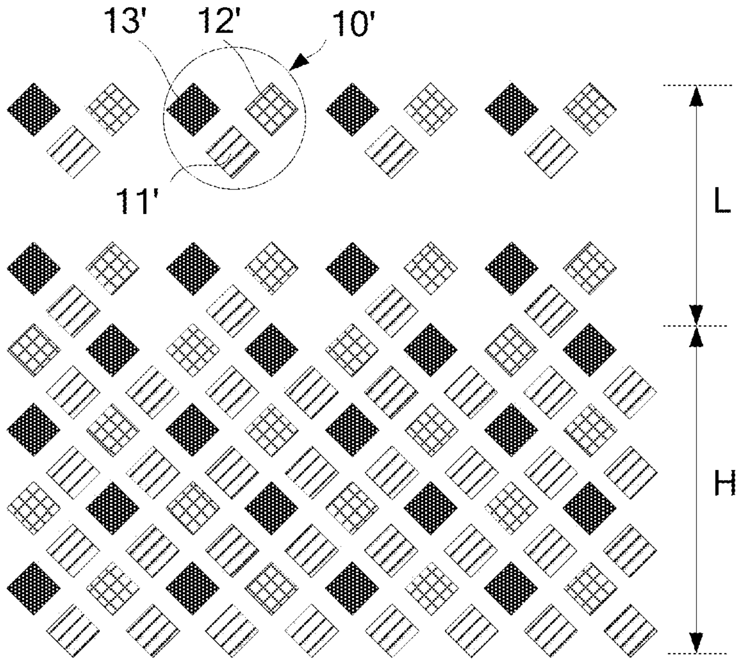
FIGS. 12 to 15 are respectively schematic pixel arranging diagrams according to other embodiments of the pixel arrangement structure of the present disclosure.

In FIGS. 9 and 12, the centers of the second sub-pixels 12' of each column of the first-category pixel groups 10' in the first pixel area L are in a same straight line, and the centers of the third sub-pixels 13' are in a same straight line. In this way, the second color and the third color within the first pixel area L can form a vertical line with a favorable consistency along a column direction, cooperating with that the first sub-pixels 11' of the first color are also aligned in the column direction, thereby making the pixel arrangement of the first pixel area L along a column direction and a row direction more uniform visually, and further improving the display quality. In FIGS. 9, 12-15, the centers of the first sub-pixel 11' of each column of the first-category pixel groups 10' in the first pixel area L and one of the fourth sub-pixel 21' and the seventh sub-pixel 24' of each column of the second-category pixel groups 20' in the second pixel area H are in the same straight line. For an embodiment in which the first color is green, human eye is more sensitive to green sub-pixels. Therefore, when the green sub-pixels of the first pixel area L and the second pixel area H are linearly aligned along a column direction, the white lines within the first pixel area L and the second pixel area H adjacent to each other along a column direction are more matched, so that the first pixel area L and the second pixel area H have a relatively smaller image change and offset, thereby enhancing the image quality.

Figure 13:
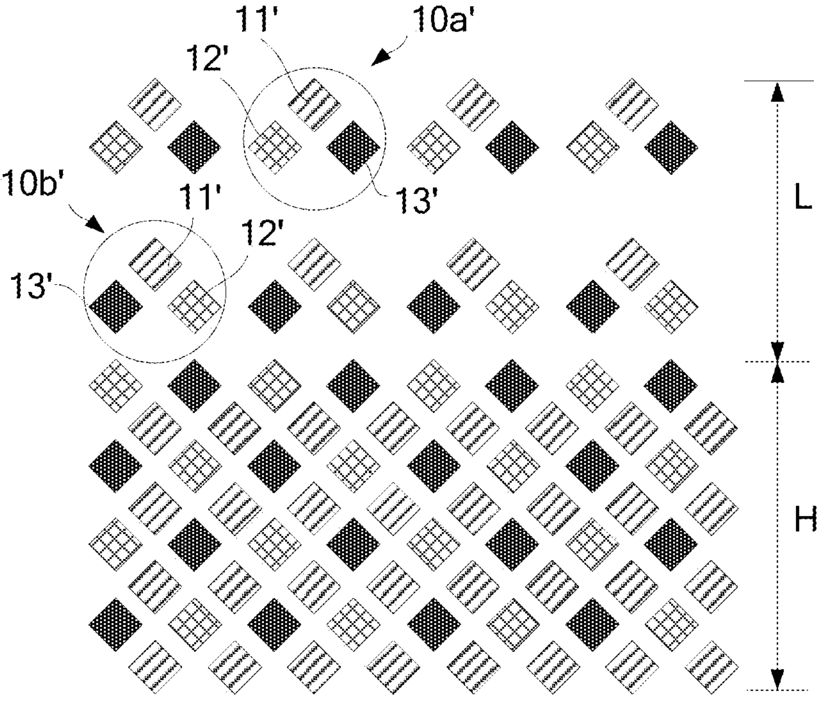

Referring to FIGS. 9 and 13, in some embodiments, the sub-pixels of the first pixel area L adjacent to the second pixel area H are the second sub-pixel 12' and the third sub-pixel 13', and the sub-pixels of the second pixel area H adjacent to the first pixel area L are the third sub-pixel 13' and the second sub-pixel 12', so that the sub-pixels of the first pixel area L and the second pixel area H adjacent to each other have different colors, thereby reducing or eliminating the color shift risk caused by color accumulation at a boundary position of the two pixel areas, and enhancing the image quality.

Figure 14:
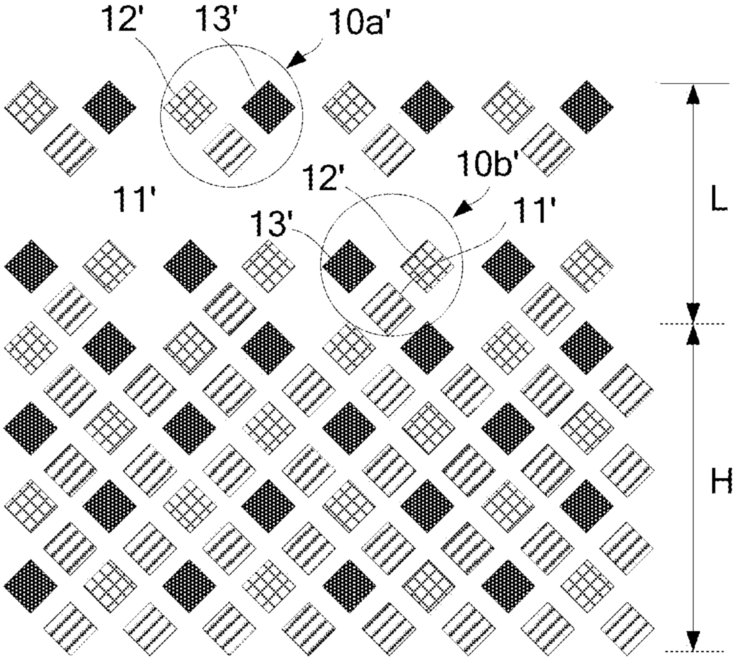

Compared with the embodiments of FIGS. 9 and 13, the first sub-pixel 11' of the first-category pixel groups 10' in the first pixel area L in the embodiments of FIGS. 12 and 14 is located on one side of the second sub-pixel 12' and the third sub-pixel 13' adjacent to the second pixel area H (i.e., a lower side of the second sub-pixel 12 and the third sub-pixel 13 in FIG. 12). This makes the sub-pixel of the first pixel area L adjacent to the second pixel area H to be the first sub-pixel 11', and the sub-pixels of the second pixel area H adjacent to the first pixel area L to be the second sub-pixel 12' and the third sub-pixel 13', so that the sub-pixels of the first pixel area L and the second pixel area H adjacent to each other have different colors, thereby reducing or eliminating the color shift risk caused by color accumulation at a boundary position of the two pixel areas, and enhancing the image quality, and it is also possible to synthesize a white light to avoid a purple color bleeding, thereby enhancing the image quality.

Referring to FIGS. 9, 12-14, by comparing the embodiments of FIGS. 13 and 14 and the embodiments of FIGS. 9 and 12, the difference lies in that the first-category pixel groups in odd-numbered and even-numbered rows in the first pixel area L have different arrangement manners. In FIGS. 13 and 14, the positions of the second sub-pixel 12' and the third sub-pixel 13' of the first-category pixel groups **10*a*' in the odd-numbered rows with respect to the first sub-pixel 11' are opposite to the positions of the second sub-pixel 12' and the third sub-pixel 13' of the first-category pixel groups 10*b*' in the even-numbered rows. The first-category pixel groups 10*a*' in the odd-numbered rows and the first-category pixel groups 10*b*' in the even-numbered rows are arranged at intervals along a column direction. This pixel structure can make the first pixel area L form an alternating form of the second sub-pixel 12' of the second color and the third sub-pixel 13'** of the third color along a column direction, which can reduce the color shift risk of single color accumulation, thereby enhancing the image quality.

In addition, referring to FIGS. 9, 12-14, in some embodiments, the centers of the second sub-pixels 12' of each column of the first-category pixel groups 10', **10*a*' or 10*b*' in at least partial rows in the first pixel area L and the centers of the fifth sub-pixels 22' of a corresponding column of the second-category pixel groups 20' in the second pixel area H are in a same straight line. In this way, the first pixel area L and the second pixel area H can form lines of a second color with relatively consistent shapes. Similarly, the centers of the third sub-pixels 13' of each column of the first-category pixel groups 10', 10*a*' or 10*b*' in at least partial rows in the first pixel area L and the centers of the sixth sub-pixels 23' of a corresponding column of the second-category pixel groups 20'** in the second pixel area H are in a same straight line. In this way, the first pixel area L and the second pixel area H can have a relatively smaller image change and offset, thereby improving the image quality.

Figure 15:
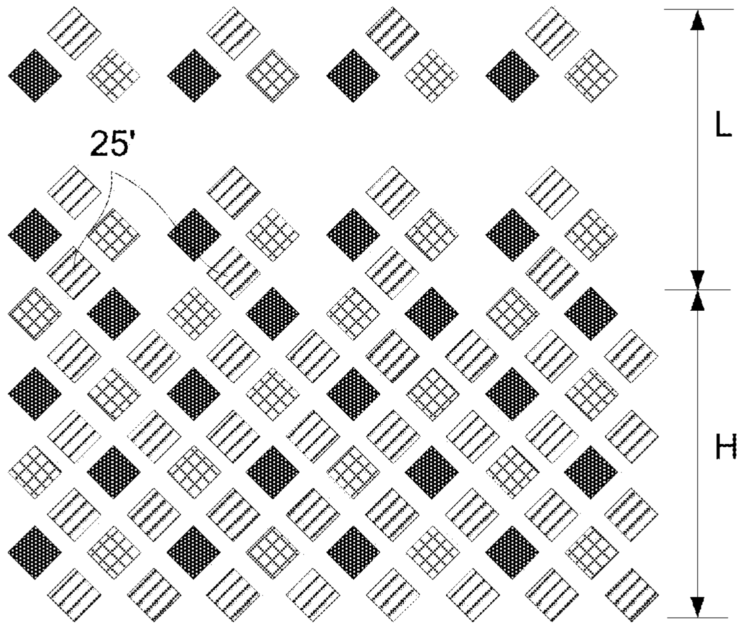
Figure 16:
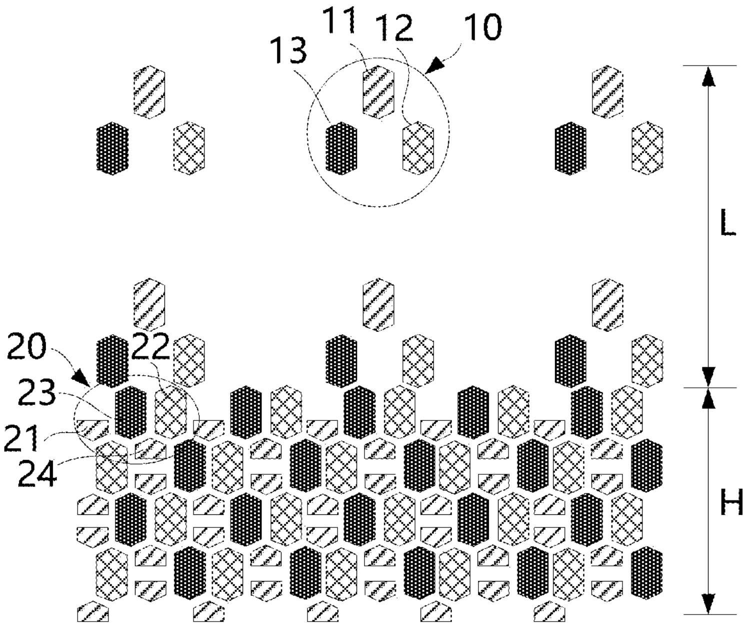
FIGS. 16-20 are respectively schematic pixel arranging diagrams according to further embodiments of the pixel arrangement structure of the present disclosure.
Figure 17:
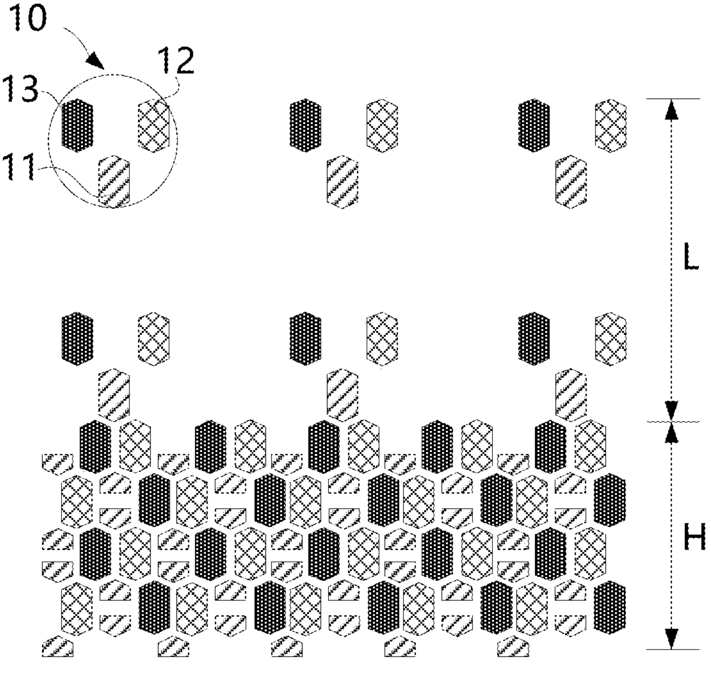
Figure 18:
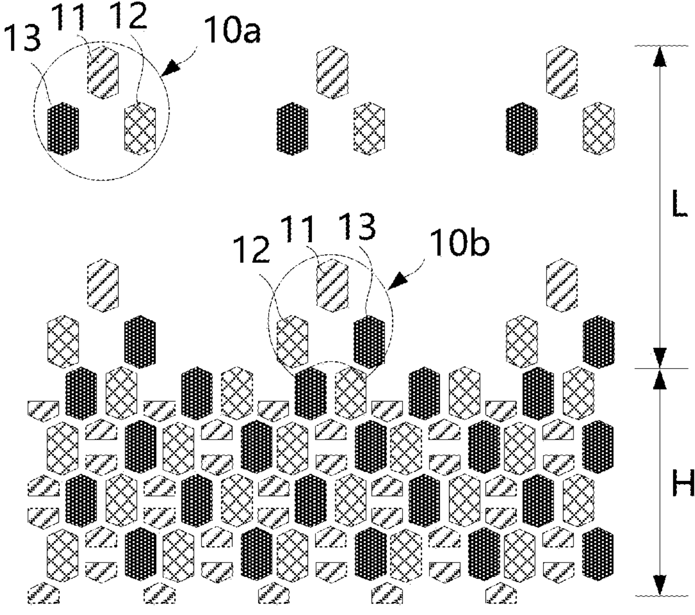
Figure 19:
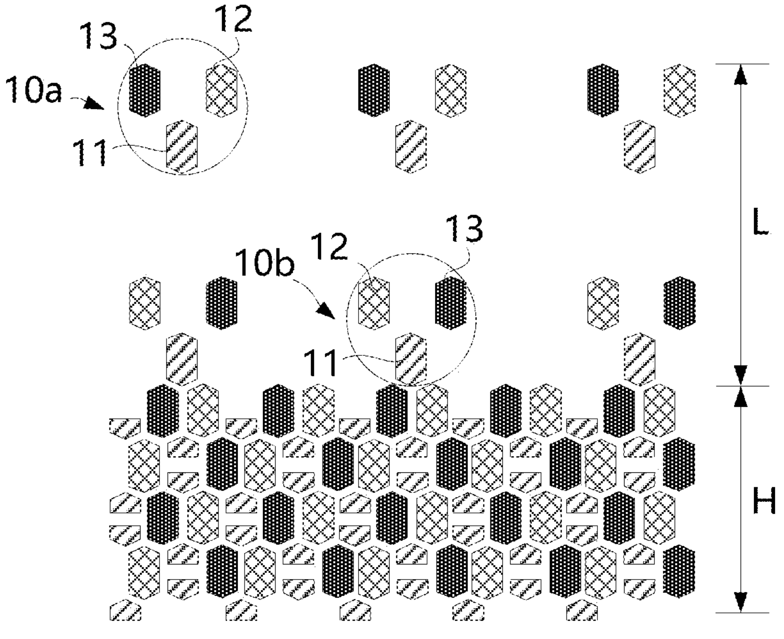
Figure 20:
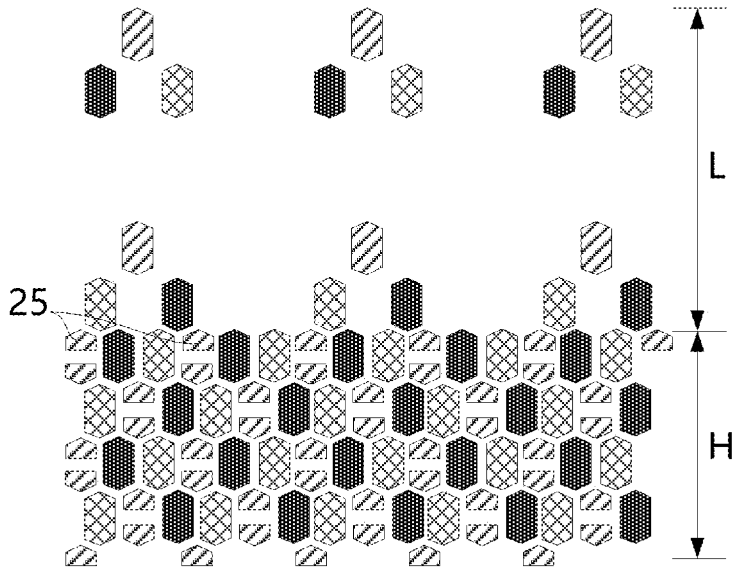

Compared with the above-described embodiments shown in FIGS. 9, 12-14, referring to FIG. 15, in some embodiments, a plurality of eighth sub-pixels 25' of the first color can be provided at positions in the second pixel area H adjacent to the first pixel area L. The eighth sub-pixel 25 is located between the second sub-pixel 12' in one of every two adjacent columns of the first-category sub-pixels 10' in the first pixel area and the third sub-pixel 13' in another of every two adjacent columns of the first-category sub-pixels 10' in the first pixel area. In FIG. 15, at a location where the first pixel area L is adjoined with the second pixel area H, the sub-pixels of the second color and the third color are present alternately, and the sub-pixels of the second color and the third color are mixed by adding the eighth sub-pixel 25', so that it is possible to eliminate a purple color bleeding risk at the adjoining position, thereby enhancing the image quality.

The eighth sub-pixel 25' can also be added to other embodiments. For example, in the embodiments of FIGS. 9 and 13, the eighth sub-pixel 25' can be disposed at a position in the second pixel area H adjacent to the first pixel area L, and between the second sub-pixel 12' and the third sub-pixel 13' between every two adjacent columns of the first-category sub-pixels in the first pixel area.

In the above-described embodiments shown in FIGS. 9-15, each of the sub-pixels included in the first-category pixel groups 10' and the second-category pixel groups 20' has a same shape, such as square. The fourth sub-pixel 21', the fifth sub-pixel 22', the sixth sub-pixel 23', and the seventh sub-pixel 24' in the second-category pixel groups 20' all have an equal area.

FIGS. 16-20 are respectively schematic pixel arranging diagrams according to further embodiments of the pixel arrangement structure of the present disclosure.

Compared with the embodiments respectively shown in FIGS. 2, 5 to 8, the embodiments respectively shown in FIGS. 16 to 20 are consistent in aspects such as the arrangement manners, colors and shapes of the sub-pixels in the first-category pixel groups 10 and the second-category pixel groups 20, and the difference lies in that the first-category pixel groups 10 in the first pixel area L in the embodiments shown in FIGS. 16 to 20 are arranged more sparsely, and pixel density of the first pixel area L is ¼ of that of the second pixel area H.

In the above-described embodiments of the arrangement structure, the first pixel area L can be in any direction of the second pixel area. For example, the second pixel area H in FIG. 1 can be on the left side, the right side and the lower side of the first pixel area L.

The above-described embodiments of the pixel arrangement structure can be applied to a display panel. Therefore, the present disclosure also provides a display panel including embodiments of any of the above-described pixel arrangement structures. The above-described embodiments of the display panel are also applicable to a display device. Therefore, the present disclosure also provides a display device including any of the foregoing display panels and a functional element. The functional element is located on one side of the display panel, and the projection of the light receiving surface thereof on the display panel is located in the first pixel area, to receive the incident light from the light emitting side of the display panel. The functional element can include at least one of a camera, an IR element, a reflective induction element, and an ambient light sensor.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A pixel arrangement structure comprising:

a first pixel area including a plurality of first-category pixel groups, sub-pixels in each first-category pixel group of which is arranged according to a first arrangement manner; and a second pixel area including a plurality of second-category pixel groups, sub-pixels in each second-category pixel group of which is arranged according to a second arrangement manner;

wherein the first pixel area has a pixel density lower than a pixel density of the second pixel area; and wherein the first arrangement manner is a Real arrangement, and the second arrangement manner is a Pentile arrangement;

each of the first-category pixel groups includes a first sub-pixel of a first color, a second sub-pixel of a second color, and a third sub-pixel of a third color, each of the second-category pixel groups comprises a fourth sub-pixel of the first color, a fifth sub-pixel of the second color, a sixth sub-pixel of the third color, and a seventh sub-pixel of the first color; and the first sub-pixel has an area bigger than a sum of areas of the fourth sub-pixel and the seventh sub-pixel.

2. The pixel arrangement structure according to claim 1, wherein a sub-pixel in the first pixel area and a sub-pixel in the second pixel area that are closest to each other are different colors.

3. The pixel arrangement structure according to claim 1, wherein in each row of the first-category pixel groups in the first pixel area, sub-pixels of one of three colors are located in a first row, and sub-pixels of the other two of the three colors are located in a second row adjacent to the first row.

4. The pixel arrangement structure according to claim 3, wherein in the first-category pixel groups in the first pixel area, sub-pixels located in the first row are misaligned arranged relative to sub-pixels located in the second row.

5. The pixel arrangement structure according to claim 1, wherein in the second pixel area, sub-pixels of a first color of three colors and sub-pixels of a second color of three colors are arranged alternatively and sub-pixels of the first color and sub-pixels of a third color of three colors are arranged alternatively, in a third direction which has an included angle with each of a row direction and a column direction; and in the second pixel area, sub-pixels of the first color and sub-pixels of the second color are arranged alternatively and sub-pixels of the first color and sub-pixels of the third color are arranged alternatively, in a fourth direction which has an included angle with each of the row direction, the column direction and the third direction.

6. The pixel arrangement structure according to claim 1, wherein the pixel density is a density of virtual pixels.

7. The pixel arrangement structure according to claim 1, wherein the pixel density of the first pixel area is 1/N of the pixel density of the second pixel area, where N is an integer greater than 1.

8. The pixel arrangement structure according to claim 1, wherein a shape of the first sub-pixel is different from that of the fourth sub-pixel and that of the seventh sub-pixel.

9. The pixel arrangement structure according to claim 1, wherein the fourth sub-pixel has an area smaller than that of the fifth sub-pixel, or the fourth sub-pixel has an area smaller than that of the sixth sub-pixel.

10. The pixel arrangement structure according to claim 1, wherein the second-category pixel groups are divided into a group of first pixels and a group of second pixels according to an arrangement manner of sub-pixels, the plurality of second-category pixel groups are arranged in an array, and the group of first pixels and the group of second pixels are both repeatedly arranged along a row direction, and arranged alternatively along a column direction.

11. The pixel arrangement structure according to claim 10, wherein centers of the first sub-pixels of each column of the first-category pixel groups in the first pixel area, and centers of seventh sub-pixels of the group of first pixels and fourth sub-pixels of the group of second pixels in the second pixel area are in a same straight line.

12. The pixel arrangement structure according to claim 1, wherein in one of the first-category pixel groups, one sub-pixel in one row has two sides respectively opposite to two sub-pixels in an adjacent row, one of the two sides is parallel to an opposite side of one of the two sub-pixels, and another one of the two sides is parallel to an opposite side of another one of the two sub-pixels.

13. The pixel arrangement structure according to claim 1, wherein in each of the first-category pixel groups, all sub-pixels are quadrilateral or rectangular.

14. The pixel arrangement structure according to claim 1, wherein in at least partial rows of the first-category pixel groups in the first pixel area, sub-pixels of each column of the first-category pixel groups are aligned.

15. The pixel arrangement structure according to claim 1, wherein in at least partial rows of the second-category pixel groups in the second pixel area, sub-pixels of each column of the second-category pixel groups are aligned.

16. The pixel arrangement structure according to claim 1, wherein each of sub-pixels in the second-category pixel groups has a same shape.

17. The pixel arrangement structure according to claim 1, wherein shape of the first sub-pixel is different from that of the fourth sub-pixel and that of the seventh sub-pixel.

18. A display panel comprises the pixel arrangement structure according to claim 1.

19. A display device, comprising:

the display panel according to claim 18; and a functional element located on an opposite side of a light emitting side of the display panel.

20. The display device according to claim 19, wherein the functional element comprises at least one of a camera, an Infrared Radiation element, a reflective induction element, and an ambient light sensor.

* * * * *